(12) United States Patent
Trotto

(10) Patent No.: US 12,066,499 B2
(45) Date of Patent: Aug. 20, 2024

(54) PIEZO SOUNDER SELF-TEST USING FEEDBACK PIN

(71) Applicant: Carrier Corporation, Palm Beach Gardens, FL (US)

(72) Inventor: Frank Trotto, Peyton, CO (US)

(73) Assignee: CARRIER CORPORATION, Palm Beach Gardens, FL (US)

(*) Notice: Subject to any disclaimer, the term of this patent is extended or adjusted under 35 U.S.C. 154(b) by 24 days.

(21) Appl. No.: 17/953,726

(22) Filed: Sep. 27, 2022

(65) Prior Publication Data

US 2023/0100592 A1 Mar. 30, 2023

Related U.S. Application Data

(60) Provisional application No. 63/249,216, filed on Sep. 28, 2021.

(51) Int. Cl.
| | |
|---|---|
| *G01R 31/50* | (2020.01) |
| *G01R 31/52* | (2020.01) |
| *G01R 31/54* | (2020.01) |
| *G08B 29/12* | (2006.01) |
| *H04R 17/00* | (2006.01) |
| *G08B 29/10* | (2006.01) |

(52) U.S. Cl.
CPC ............ *G01R 31/50* (2020.01); *G01R 31/52* (2020.01); *G01R 31/54* (2020.01); *G08B 29/126* (2013.01); *H04R 17/00* (2013.01); *G08B 29/10* (2013.01)

(58) Field of Classification Search
CPC ........ G01R 31/50; G01R 31/52; G01R 31/54; H01R 17/00; G08B 29/126
See application file for complete search history.

(56) References Cited

U.S. PATENT DOCUMENTS

| | | | |
|---|---|---|---|
| 4,481,502 A | * | 11/1984 | Dawson ............... G08B 29/145 340/629 |
| 5,638,043 A | | 6/1997 | Sakai et al. |
| 6,310,540 B1 | | 10/2001 | Burnett et al. |
| 8,228,182 B2 | | 7/2012 | Orsini et al. |
| 8,294,566 B2 | | 10/2012 | Morwood et al. |
| 8,634,945 B2 | | 1/2014 | Phelippeau et al. |
| 9,007,201 B2 | | 4/2015 | Piccolo, III et al. |

(Continued)

FOREIGN PATENT DOCUMENTS

| | | | | |
|---|---|---|---|---|
| CA | 2170561 C | * | 1/2001 | ............. G01V 1/008 |
| CN | 201035979 Y | | 3/2008 | |

(Continued)

OTHER PUBLICATIONS

European Search Report for Application No. 22198475.5; Issued Feb. 21, 2023; 7 Pages.

*Primary Examiner* — Christopher E Mahoney
(74) *Attorney, Agent, or Firm* — CANTOR COLBURN LLP

(57) ABSTRACT

A system and method for performing a self-testing a piezo sounder using a feedback pin while being driven by an ultra-sonic frequency. A method includes operating a sounder device in a test mode, the sounder device is operated in an inaudible frequency range during the test mode and detecting a feedback response voltage. The method includes comparing the feedback response voltage to a reference voltage and providing an indication of a failure mode based at least in part on the feedback response voltage.

16 Claims, 4 Drawing Sheets

(56) References Cited

U.S. PATENT DOCUMENTS

| | | | |
|---|---|---|---|
| 9,014,400 B2 | 4/2015 | Barson | |
| 9,076,313 B2 | 7/2015 | Piccolo, III et al. | |
| 9,454,893 B1 | 9/2016 | Warren et al. | |
| 9,583,089 B2 | 2/2017 | Nagashima et al. | |
| 9,940,824 B2 | 4/2018 | Berezowski et al. | |
| 10,054,607 B2 | 8/2018 | Unsal et al. | |
| 10,659,895 B2 | 5/2020 | Nomoto et al. | |
| 2015/0055786 A1* | 2/2015 | Barson | H03F 3/217 |
| | | | 381/59 |

FOREIGN PATENT DOCUMENTS

| | | |
|---|---|---|
| CN | 102332257 A | 1/2012 |
| CN | 202352324 U | 7/2012 |
| CN | 103390401 A | 11/2013 |
| CN | 203519762 U | 4/2014 |
| DE | 10102856 A1 | 9/2002 |
| DE | 102016110680 A1 | 12/2017 |
| EP | 1898377 A1 | 3/2008 |
| EP | 2843655 A2 | 3/2015 |
| GB | 2388916 A | 11/2003 |
| JP | H02133653 U * | 11/1990 |
| JP | H02138710 U * | 11/1990 |
| JP | 2006235853 A | 9/2006 |
| KR | 101081826 B1 | 11/2011 |
| KR | 102000628 B1 | 7/2019 |

\* cited by examiner

PIEZO SOUNDER SELF-TEST USING FEEDBACK PIN

CROSS-REFERENCE TO RELATED APPLICATIONS

This application claims the benefit of Provisional Application No. 63/249,216 filed Sep. 28, 2021, the disclosure of which is incorporated herein by reference in its entirety.

BACKGROUND

The present disclosure relates to self-testing hardware, and more specifically, to self-testing a piezo sounder device using a feedback pin.

A sounder or buzzer can be used to indicate an alarm condition or a failure condition for various applications. For example, a smoke detector can be equipped with a sounder or buzzer. The alarms can be used to safety-critical conditions such as threatening smoke or fire. There may be a need to perform a sounder self-test to ensure the correct operation of the sounder and associated circuitry.

BRIEF DESCRIPTION

According to an embodiment, a system for self-testing a piezo sounder using a feedback pin while being driven by an ultra-sonic frequency is provided. The system can include a sounder comprising a first pin, a second pin, and a feedback pin; a driver circuit coupled to the first pin and the second pin of the sounder; a feedback monitoring circuit coupled to a feedback pin of the sounder; and a controller coupled to the driver circuit and the feedback circuit. The controller is configured to operate the sounder device in a test mode, wherein the sounder device is operated in an inaudible frequency range during the test mode; detect a feedback response voltage from the feedback monitoring circuit; compare the feedback response voltage to a reference voltage; and provide an indication of a failure mode based at least in part on the feedback response voltage.

In addition to one or more of the features described herein, or as an alternative, further embodiments include a controller that is configured to subsequently operate the sounder device in at least one of a test mode and a normal mode.

In addition to one or more of the features described herein, or as an alternative, further embodiments include a controller that provides a signal to the driver circuit to drive the sounder device at a frequency greater than 20 kHz when operated in the test mode.

In addition to one or more of the features described herein, or as an alternative, further embodiments include a controller that provides a signal to the driver circuit to drive the sounder device at a frequency less than 20 kHz when operated in the normal mode.

In addition to one or more of the features described herein, or as an alternative, further embodiments include a driver circuit that is an H-bridge circuit.

In addition to one or more of the features described herein, or as an alternative, further embodiments include providing an output of the feedback monitoring circuit that indicates at least one of a failure or a non-failure of the sounder.

In addition to one or more of the features described herein, or as an alternative, further embodiments include providing a visual indication of a result of a test mode.

In addition to one or more of the features described herein, or as an alternative, further embodiments include using a feedback monitoring circuit that includes a window.

According to an embodiment, a method for self-testing a piezo sounder using a feedback pin while being driven by an ultra-sonic frequency is provided. The method includes operating a sounder device in a test mode, wherein the sounder device is operated in an inaudible frequency range during the test mode; detecting a feedback response voltage; comparing the feedback response voltage to a reference voltage; and providing an indication of a failure mode based at least in part on the feedback response voltage.

In addition to one or more of the features described herein, or as an alternative, further embodiments include a sounder device that is subsequently operable to be operated in at least one of the test mode and a normal mode.

In addition to one or more of the features described herein, or as an alternative, further embodiments include operating the sounder device at a frequency greater than 20 kHz when operated in the test mode.

In addition to one or more of the features described herein, or as an alternative, further embodiments include operating the sounder device at a frequency less than 20 kHz when operated in the normal mode.

In addition to one or more of the features described herein, or as an alternative, further embodiments include using driver circuit that is an H-bridge circuit.

In addition to one or more of the features described herein, or as an alternative, further embodiments include outputting an indication that is at least one of a failure or a non-failure of the sounder device is detected.

In addition to one or more of the features described herein, or as an alternative, further embodiments include providing a visual indication of a result of a test mode.

In addition to one or more of the features described herein, or as an alternative, further embodiments include comparing the feedback response voltage to a window to determine the failure mode.

Technical effects of embodiments of the present disclosure include detecting failures modes including open circuits or short circuits that may be present in the sounder or associated circuits.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

Many alarm systems include an audible sounding device to alert various conditions detected by the alarm system. In order to test the sounding device, users are generally required to press a pushbutton located on the device. However, while users are pressing the pushbutton and are within close proximity of the sounding device, the users are exposed to the loud volume of the sounding device. Issues can arise when the user is exposed to the loud audible alarm that may damage the hearing of the user. Also, because testing the alarms is manual test and requires the user to initiate the test, many users (such as homeowners), do not preform the test. Therefore, the sounder is essentially untested for most of the product life cycle.

The techniques described herein allow the testing of the sounding device without exposing the user to a loud audible signal of the alarms. The techniques described herein provide for testing the sounding device by testing an inaudible range. An output from the feedback monitoring circuit can indicate if there is a short/open in the circuitry that can lead to a failure. In addition, the techniques described herein provide an automated self-test method that not only makes the test inaudible, but also it is autogenerated so that the user is not required to interface with the alarm for the test unless a failure is detected. In such cases, a fault message can be communicated to the user to replace the unit.

One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

Figure 1:
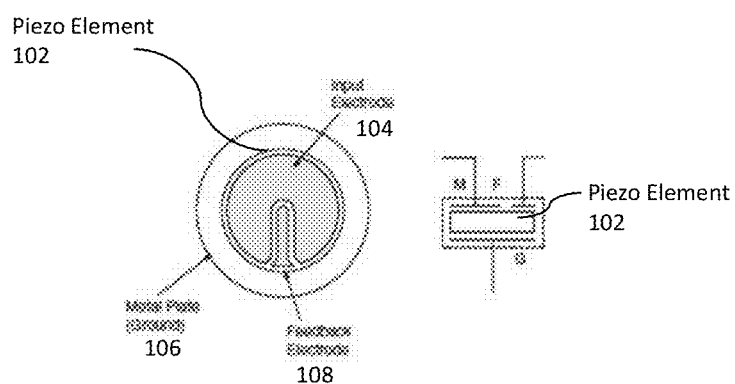
FIG. 1 depicts a 3-pin piezo sounder in accordance with one or more embodiments of the disclosure.

FIG. 1 depicts a sounder device 100 that can be used in accordance with one or more embodiments of the disclosure. The sounder device 100 is a piezo buzzer that includes a disc that can be vibrated at different frequencies in both the audible frequency range (approximately 20 Hz to 20 kHz) and the inaudible frequency range (greater than 20 kHz). The sounder device 100 can include an input electrode 104, metal plate (ground) 106, and a feedback electrode 108 (also referred to as a feedback pin). The input electrode 104 and the metal plate 106 are coupled to the Piezo element (disc) 102 of the sounder device 100 that is deflected to generate sound. The input electrode 104 and in some instances the metal plate 106 is connected to outputs of the driver circuit 202 (shown in FIG. 2) that is used to provide a signal to actuate the disc. The feedback electrode 108 is coupled to a feedback monitoring circuit 204. FIG. 1 also depicts a circuit representing the connections to the sounding device 100. The piezo element 102 is positioned between the ground plate 106 and the input electrode 104. An input (M) is connected to the input electrode 104 and the metal plate 106 is grounded at pin (G). A feedback electrode 108 is provided on the piezo element and includes a pin (F).

Figure 2:
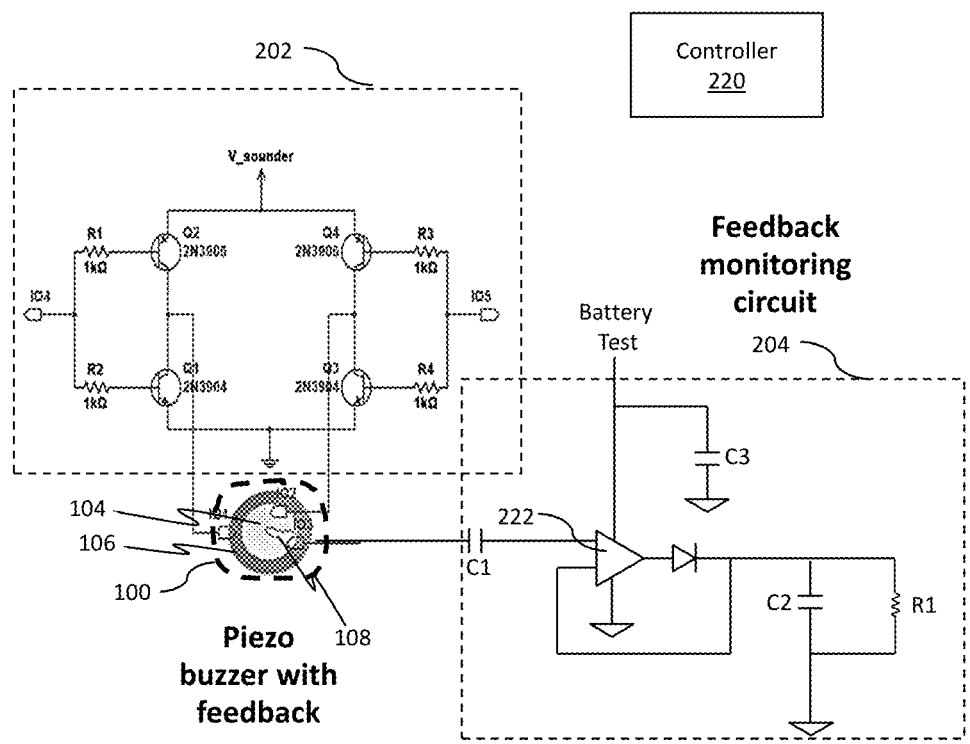
FIG. 2 depicts a system for performing self-testing a piezo sounder using a feedback pin in accordance with one or more embodiments of the disclosure.

FIG. 2 depicts a sounder test system 200 in accordance with one or more embodiments of the disclosure. The sounder test system 200 can include the sounder device 100 shown in FIG. 1 or other types of 3-pin sounder devices or buzzer devices. FIG. 2 depicts an example driver circuit 202 having a first output that is coupled to a first pin (input electrode 104) and having a second output that is coupled to a second pin (metal plate 106) of the sounder device 100. The driver circuit 202 is controlled by a controller 220. The controller 220 can provide control signals to the input pins 104, 105 of the driver circuit 202 to drive the sounder device 100. In one or more embodiments of the disclosure, the controller 220 can operate the sounder device 100 in a normal mode and a test mode by providing the appropriate input signals to the driver circuit 202. When operated in the normal mode, the controller 220 provides input signals to the driver circuit 202 to control the sounder device 100 to vibrate the piezo element 102 in the audible frequency range. When the system 200 is operated in the test mode, the controller 220 provides input signals to the driver circuit 202 to control the sounder device 100 to vibrate the piezo element 102 in the inaudible frequency range (ultra-sonic frequency range).

The driver circuit 202 is arranged in an H-bridge configuration where the inputs 104, 105 are driven by the controller 220 to provide a signal to the sounder device 100 to cause the piezo element 102 to vibrate at a determined frequency for the selected mode of operation. As shown in this non-limiting example, the H-bridge configuration of the driver circuit 202 includes 4 switching devices (bipolar junction transistors, field-effect transistors, etc.) that allow the current signal to flow through the sounder device 100 in an alternating fashion to drive the piezo element 102. It can be appreciated that other arrangements for the driver circuit 202 can be used and is not limited by that shown in FIG. 2.

The feedback electrode 108 of the sounder device 100 is not actively driven by a control signal but rather it is used to passively detect the voltage of the piezo element 102 during operation. The sounder test system 200 also includes a feedback monitoring circuit 204 that is coupled to the feedback electrode 108 of the sounder device 100. The feedback monitoring circuit 204 can include DC filtering elements, such as a capacitor or other types of filters, to remove the DC component from the voltage detected at the feedback electrode 108. The feedback monitoring circuit 204 includes an operational amplifier 222 that is used to compare the detected feedback response voltage (input) from the feedback electrode 108 to a reference voltage to determine an operational status of the sounder device 100 during the test. The reference voltage can be configured based on the power requirements for the sounder device 100. The reference voltage can also be provided as a function of the output of the operational amplifier 222 that is provided to the input of the operational amplifier 222. The operational status can indicate a failure mode or non-failure mode. For example, the failure mode can indicate whether a short or open circuit has been detected in the sounder test system 200. The non-failure mode can indicate that no short or open circuit has been detected. In one or more embodiments of the disclosure, the output signal from the feedback monitoring circuit 204 can be provided to an indicator such as a light emitting diode (LED) (not shown) to allow a user to visibly determine the operational status of the sounder device 100 and whether it is operating normally. Also, when the sounder test system 200 is operated in the test mode, the output of the feedback monitoring circuit 204 produces an output signal that can be provided to and read by the controller 220.

In a non-limiting example, when the output of the operational amplifier 222 is driven high based on the comparison of the feedback response voltage and the reference voltage, the output can be used to indicate the failure mode. If the output of the operational amplifier 222 is driven low based on the comparison, the output can be used to indicate that no failure mode is detected.

In one or more embodiments of the disclosure, the test can be initiated by pressing a pushbutton (not shown) that is located on the alarm device including the sounder device 100. The pushbutton causes the controller 220 to provide a signal to drive the sounder device 100 in the ultra-frequency range (inaudible frequency range) for the test. Alternatively, in other embodiments, the self-test can be initiated periodically without intervention from a user. The controller 220 can be programmed to automatically perform the self-test periodically which does not require the push button to be pressed. The feedback electrode 108 of the sounder device 100 detects the amplitude (peak) at which the disc of the sounder device 100 is vibrating. The DC component that is detected at the feedback electrode 108 can be filtered out using the capacitor C1. The feedback monitoring circuit 204 detects the voltage peaks from the voltage of the feedback electrode 108. Therefore, the DC component is not needed and is filtered out.

In one or more embodiments of the disclosure, the feedback monitoring circuit 204 coupled to the sounder device 100 can use the peak detected voltage from the feedback electrode 108 to determine a failure mode. The feedback monitoring circuit 204 detects the voltage from the feedback electrode 108 during the test mode of the sounder device 100 while being operated in the inaudible range without exposing the user to loud alarms. In one or more embodiments of the disclosure, the detected failures can indicate a short or an open circuit within the circuitry for the sounder.

Figure 3:
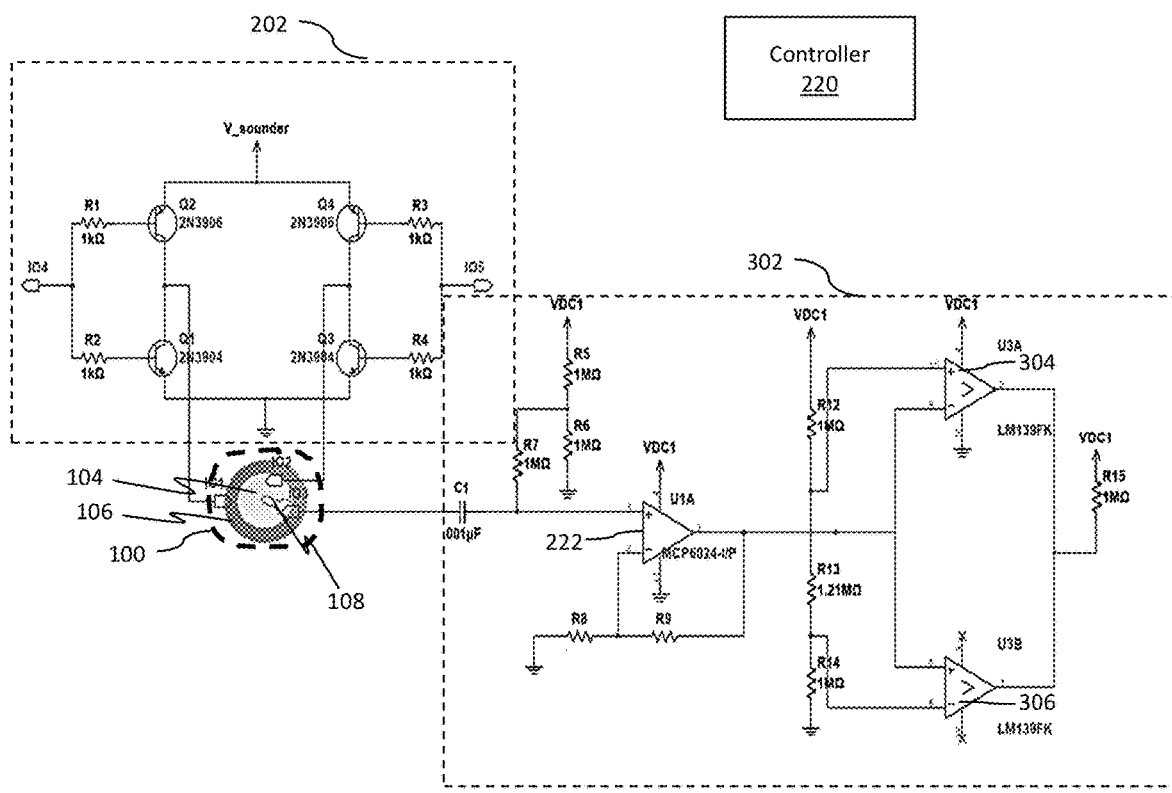
FIG. 3 depicts a system having a window comparator circuit in accordance with one or more embodiments of the disclosure.

FIG. 3 depicts an example alternative arrangement for a feedback monitoring circuit 302 in accordance with one or more embodiments of the disclosure. A window comparator circuit 304, 306 is used to set the amplitude (peak) and time (duration) between transitions detected from the feedback electrode 108 of the sounder device 100. It can be appreciated that the amplitude and time between transitions can be used to detect a failure. The window comparator circuit 304, 306 can be used to configure the bounds for an acceptable output range of operations for the sounder device 100 from the voltage provided from the feedback electrode 108. The output of the window comparator circuit 304, 306 can be sent to a controller 220 for analysis. The output voltages of the window comparator circuit 304, 306 that are detected within a window at the output of the feedback monitoring circuit 302 can indicate the proper operation of the sounder device 100. The output voltages that are detected outside of the window established by the window comparator circuit 304, 306, can indicate a failure whether the voltages exceed the upper limit of the window or are less than the lower limit of the window. Different failure modes can be indicated based upon the value of the detection. For example, an open circuit can be indicated by 0 V and a short can be indicated by values greater than the window. In a non-limiting example, a feedback response voltage approximately equal to 0.2 Vp-p detected at the output of the feedback monitoring circuit 302 can indicate the normal operation of the sounder device 100 while other values can indicate a failure mode.

Figure 4:
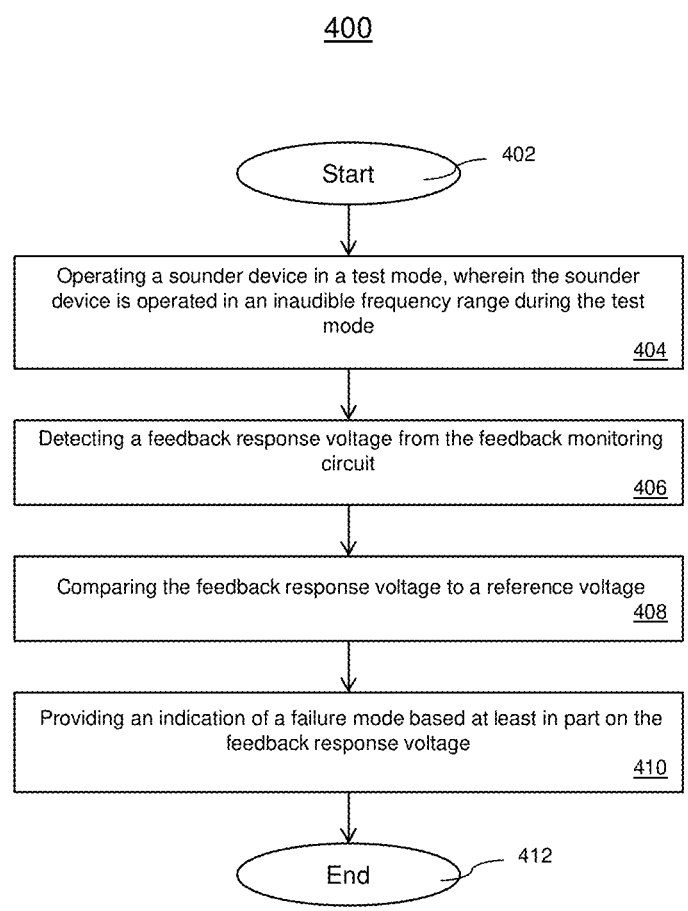
FIG. 4 depicts a method for performing a self-testing a piezo sounder using a feedback pin while being driven by an ultra-sonic frequency in accordance with one or more embodiments of the disclosure.

FIG. 4 depicts a flowchart of a method 400 for performing a sounder self test in accordance with one or more embodiments of the disclosure. The method 400 can be implemented in using a sounder device 100 and system 200 as shown in FIGS. 1, 2, and 3. The method 400 begins at block 402 and proceeds to block 404 which provides for operating a sounder device in a test mode, wherein the sounder device is operated in an inaudible frequency range during the test mode.

Block 406 detects a feedback response voltage. When operating the sounder device in test mode, the feedback pin detects the operation of the sounder device and provides an input (feedback response voltage) to the coupled feedback monitoring circuit 204.

Block 408 compares the feedback response voltage to a reference voltage. An operational amplifier of the feedback monitoring circuit compares the feedback response voltage (input) to the reference voltage. It can be appreciated the output of the operational amplifier can be provided in different arrangements. For example, an indication that the feedback response voltage is higher than the reference voltage can indicate a failure. Alternatively, an indication that the feedback response voltage is lower than the reference voltage can indicate a failure in other configurations.

Block 410 provides an indication of a failure mode based at least in part on the feedback response voltage. The output of the comparator can be used provide an indication of a detection of a failure mode. The output of the feedback monitoring circuit can be provided to a controller where the controller controls a visual indication of an LED to indicate the detection of a failure mode. The method 400 ends at block 412. It is to be understood that the steps of the method 400 are not limited by that shown in FIG. 4 for are only provided for illustrative purposes.

One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

The techniques described herein enable the testing of a sound producing device that is performed in the inaudible range to determine the integrity of the sounder and associated circuits.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system for self-testing a piezo sounder using a feedback pin while being driven by an ultra-sonic frequency, the system comprising:
   a sounder comprising a first pin, a second pin, and a feedback pin;
   a driver circuit coupled to the first pin and the second pin of the sounder;
   a feedback monitoring circuit coupled to a feedback pin of the sounder, the feedback monitoring circuit including a DC filtering element to remove a DC component from the voltage detected at the feedback pin, and an operational amplifier,
   a controller coupled to the driver circuit and the feedback monitoring circuit, wherein the controller is configured to:
      operate the sounder device in a test mode, wherein the sounder device is operated in an inaudible frequency range during the test mode;
      detect a feedback response voltage from the feedback monitoring circuit;
      compare the feedback response voltage to a reference voltage using the operational amplifier; and
      provide an indication of a failure mode based at least in part on the feedback response voltage.

2. The system of claim 1, wherein the controller is configured to subsequently operate the sounder device in at least one of a test mode and a normal mode.

3. The system of claim 2, wherein when operated in the test mode, the controller provides a signal to the driver circuit to drive the sounder device at a frequency greater than 20 kHz.

4. The system of claim 2, wherein when operated in the normal mode, the controller provides a signal to the driver circuit to drive the sounder device at a frequency less than 20 kHz.

5. The system of claim 2, wherein the driver circuit is an H-bridge circuit.

6. The system of claim 1, wherein an output of the feedback monitoring circuit indicates at least one of a failure or a non-failure of the sounder.

7. The system of claim 6, wherein the output of the feedback monitoring circuit is used to provide a visual indication of a result of a test mode.

8. The system of claim 1, wherein the feedback monitoring circuit comprises a window comparator circuit.

9. A method for self-testing a piezo sounder using a feedback pin while being driven by an ultra-sonic frequency, the method comprising:
   operating a sounder device in a test mode, wherein the sounder device is operated in an inaudible frequency range during the test mode;
   detecting a feedback response voltage;
   removing a DC component from the feedback response voltage;
   comparing the feedback response voltage to a reference voltage using an operational amplifier; and
   providing an indication of a failure mode based at least in part on the feedback response voltage.

10. The method of claim 9, wherein the sounder device is subsequently operable to be operated in at least one of the test mode and a normal mode.

11. The method of claim 10, wherein when operated in the test mode, operating the sounder device at a frequency greater than 20 KHz.

12. The method of claim 10, wherein when operated in the normal mode, operating the sounder device at a frequency less than 20 KHz.

13. The method of claim 10, wherein the driver circuit is an H-bridge circuit.

14. The method of claim 9, further comprising outputting an indication that is at least one of a failure or a non-failure of the sounder device is detected.

15. The method of claim 14, wherein the indication is used to provide a visual indication of a result of a test mode.

16. The method of claim 9, further comprising comparing the feedback response voltage to a window to determine the failure mode.

* * * * *